(12) United States Patent
Neuendorffer et al.

(10) Patent No.: US 7,541,833 B1
(45) Date of Patent: Jun. 2, 2009

(54) VALIDATING PARTIAL RECONFIGURATION OF AN INTEGRATED CIRCUIT

(75) Inventors: Stephen A. Neuendorffer, San Jose, CA (US); Brandon J. Blodget, Santa Clara, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/973,781

(22) Filed: Oct. 9, 2007

(51) Int. Cl.
*H03K 19/173* (2006.01)
(52) U.S. Cl. .......................................... 326/38; 326/41
(58) Field of Classification Search .............. 326/37–41
See application file for complete search history.

(56) References Cited

U.S. PATENT DOCUMENTS

| 7,019,558 | B1 * | 3/2006 | Jacobson et al. | 326/38 |
| 7,249,010 | B1 | 7/2007 | Sundararajan et al. | |
| 7,313,730 | B1 * | 12/2007 | Ryser | 714/30 |
| 7,402,443 | B1 * | 7/2008 | Pang et al. | 438/14 |
| 2007/0182445 | A1 * | 8/2007 | Chen et al. | 326/39 |

OTHER PUBLICATIONS

U.S. Appl. No. 10/917,033, Patterson, Cameron D. et al., entitled "Method and System for Identifying Essential Configuration Bits", filed Aug. 12, 2004 (52 pages), Xilinx, Inc., 2100 Logic Drive, San Jose, California.

U.S. Appl. No. 10/917,064, Patterson, Cameron D. et al., entitled "Method and System for Generating a Bitstream View of a Design" filed Aug. 12, 2004 (51 pages), Xilinx, Inc., 2100 Logic Drive, San Jose, California.

\* cited by examiner

*Primary Examiner*—Don P Le
(74) *Attorney, Agent, or Firm*—LeRoy D. Maunu

(57) ABSTRACT

Approaches for validating a configuration bitstream used for partially reconfiguring an ingrated circuit such as a programmable logic device (PLD) are disclosed. In one approach, the integrated circuit is configured with a first configuration bitstream that includes first bit values that produce an implementation of a static part of a design on the integrated circuit. Any differences between a bit value in a second configuration bitstream and a corresponding bit value of the implementation of the static part of the design are determined. The second configuration bitstream includes second bit values that produce an implementation of a reconfigurable part of the design on the integrated circuit. A first signal state is output in response to determining that there are no differences, and a second signal state is output in response to determining that there are differences.

20 Claims, 6 Drawing Sheets

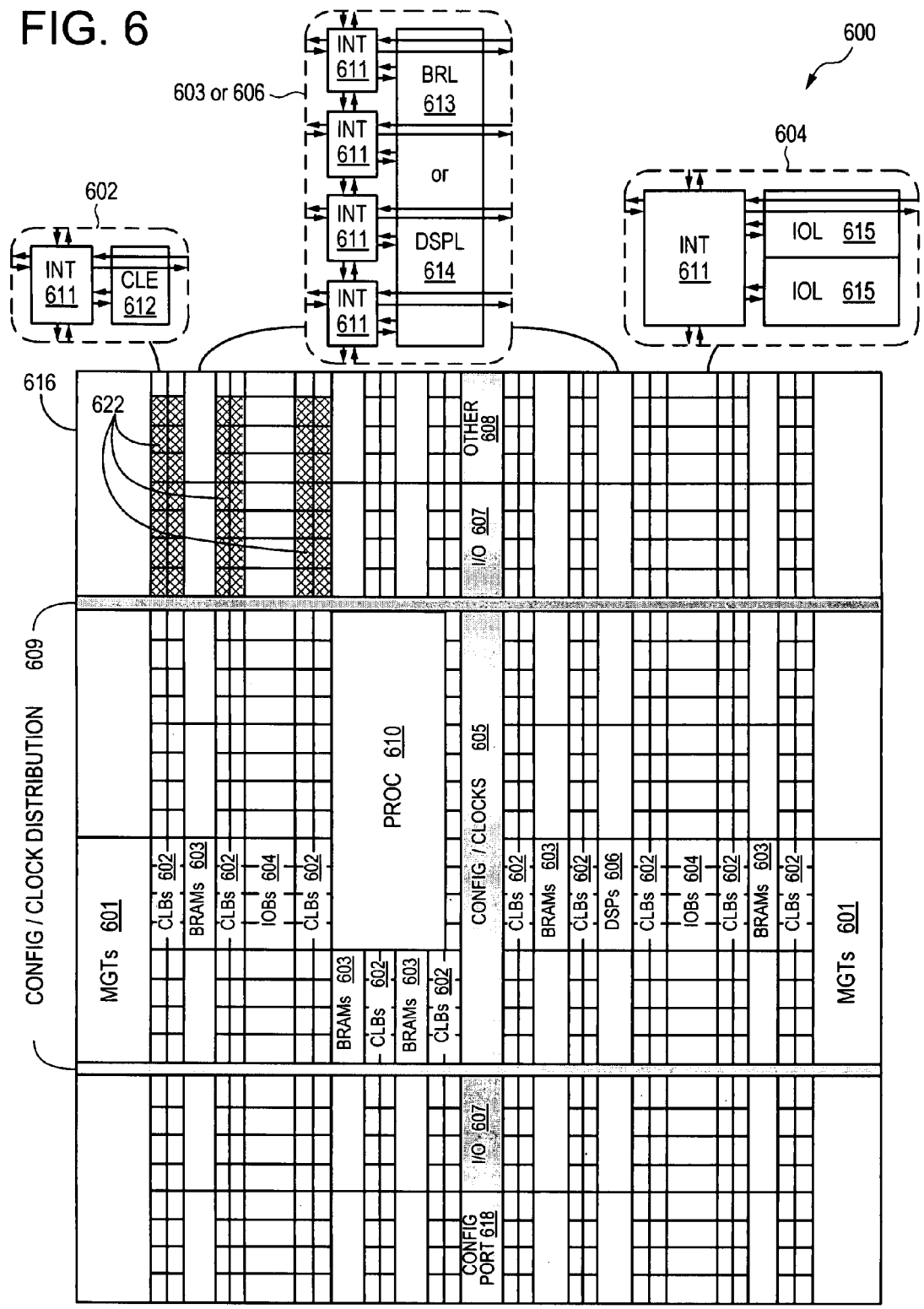

US 7,541,833 B1

VALIDATING PARTIAL RECONFIGURATION OF AN INTEGRATED CIRCUIT

FIELD OF THE INVENTION

The present invention generally relates to protecting against malicious partial reconfiguration of an integrated circuit such as a programmable logic device (PLD).

BACKGROUND

Programmable Logic Devices (PLDs) are Integrated Circuits (ICs) that are used to implement logic operations according to user-configurable input. Example PLDs include Complex Programmable Logic Devices (CPLDs) and Field Programmable Gate Arrays (FPGAs). CPLDs often include several function blocks that are based on a programmable logic array (PLA) architecture with sum-of-products logic. A configurable interconnect matrix transmits signals between the function blocks.

An example FPGA includes an array of configurable logic blocks (CLBs) and a ring or columns of programmable input/output blocks (IOBs). The CLBs and IOBs are interconnected by a programmable interconnect structure (routing resources). The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, such as an external integrated circuit memory EEPROM, EPROM, PROM, and the like, though other types of memory may be used. The collective states of the individual memory cells then determine the function of the FPGA.

PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Some PLDs, such as various FPGAs from Xilinx, Inc., may be partially reconfigured. That is, the PLD may be initially configured with a first configuration bitstream. At some later time, a part of the PLD may be reconfigured without disturbing the configuration of the rest of the PLD. This capability allows a system design to be part static and part dynamic. The static part of the design contains a conceptual socket on the PLD into which the dynamic part of the design may be inserted. The dynamic part of the design may include, for example, different modules that are tailored to different processing needs of the static part of the design. The PLD may be configured with one module when one type of data is being processed and then may be partially reconfigured with another module when another type of data is to be processed.

Today's large-scale designs may be composed of multiple parts for which different parties may be responsible. For example, libraries of logic cores may be developed and distributed by one company for use by other companies in integrating a large scale system. Relative to partial reconfiguration scenarios, one company may develop the static part of the design and use the logic cores from another company for the dynamic part of the design.

SUMMARY

The different embodiments of the invention provide various approaches for validating a configuration bitstream used for partially reconfiguring a programmable logic device (PLD), such as a field programmable gate array (FPGA), for example. In one embodiment, a method includes configuring the PLD with a first configuration bitstream, wherein the first configuration bitstream includes first bit values that produce an implementation of a static part of a design on the PLD. The method determines whether any bit value in a second configuration bitstream is different from a corresponding bit value of the implementation of the static part of the design. The second configuration bitstream includes second bit values that produce an implementation of a reconfigurable part of the design on the PLD. A first signal state is output in response to determining that no bit values in the second configuration bitstream are different from corresponding bit values of the implementation of the static part of the design. A second signal state is output in response to determining that one or more bit values in the second configuration bitstream are different from corresponding bit values of the implementation of the static part of the design.

In another embodiment, an apparatus is provided for validating a configuration bitstream used for partially reconfiguring a PLD. The apparatus comprises means for configuring the PLD with a first configuration bitstream, wherein the first configuration bitstream includes first bit values that produce an implementation of a static part of a design on the PLD; means for determining whether any bit value in a second configuration bitstream is different from a corresponding bit value of the implementation of the static part of the design, wherein the second configuration bitstream includes second bit values that produce an implementation of a reconfigurable part of the design on the PLD; means for outputting a first signal state in response to determining that no bit values in the second configuration bitstream are different from corresponding bit values of the implementation of the static part of the design; and means for outputting a second signal state in response to determining that one or more bit values in the second configuration bitstream are different from corresponding bit values of the implementation of the static part of the design.

An article of manufacture is provided in another embodiment. The apparatus includes a processor-readable medium storage configured with processor-executable instructions for validating a configuration bitstream used for partially reconfiguring a PLD. Execution of the instructions cause one or more processors to perform steps including, configuring the PLD with a first configuration bitstream. The first configuration bitstream includes first bit values that produce an implementation of a static part of a design on the PLD. Another step determines whether any bit value in a second configuration bitstream is different from a corresponding bit value of the implementation of the static part of the design. The second configuration bitstream includes second bit values that produce an implementation of a reconfigurable part of the design on the PLD. A first signal state is output in response to determining that no bit values in the second configuration bitstream are different from corresponding bit values of the implementation of the static part of the design. A second signal state is output in response to determining that one or more bit values in the second configuration bitstream are different from corresponding bit values of the implementation of the static part of the design.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which:

FIG. 6 illustrates an example FPGA architecture on which a system may be implemented using the various approaches described herein.

DETAILED DESCRIPTION OF THE DRAWINGS

The capability to partially reconfigure a programmable logic device (PLD) provides system designers with a great deal of flexibility. However, this flexibility may increase the risk that through partial reconfiguration the static part of the design will be left open to inadvertent or malicious changes that may cause the system to fail. For example, a designer may attempt to customize the design outside the control of the tools used to translate a design specification into a configuration bitstream. This customization may be for purposes of achieving more control over the implementation. However, the designer may be unaware of constraints the tools automatically impose. For example, the routing resources used in a portion of the static part of the design may lie within a socket area generally designated for the reconfigurable part of the design. In another scenario, the reconfigurable portion of the design may be provided by a source other than the user or the designer of the static portion of the design. The level of risk introduced by using a reconfigurable portion of the design from another source depends on the relationship between the user and this other source. The inadvertent alteration of these resources may cause serious problems in operating the implemented design on the PLD. The various embodiments of the invention described herein may address one or more of the above issues.

Figure 1:
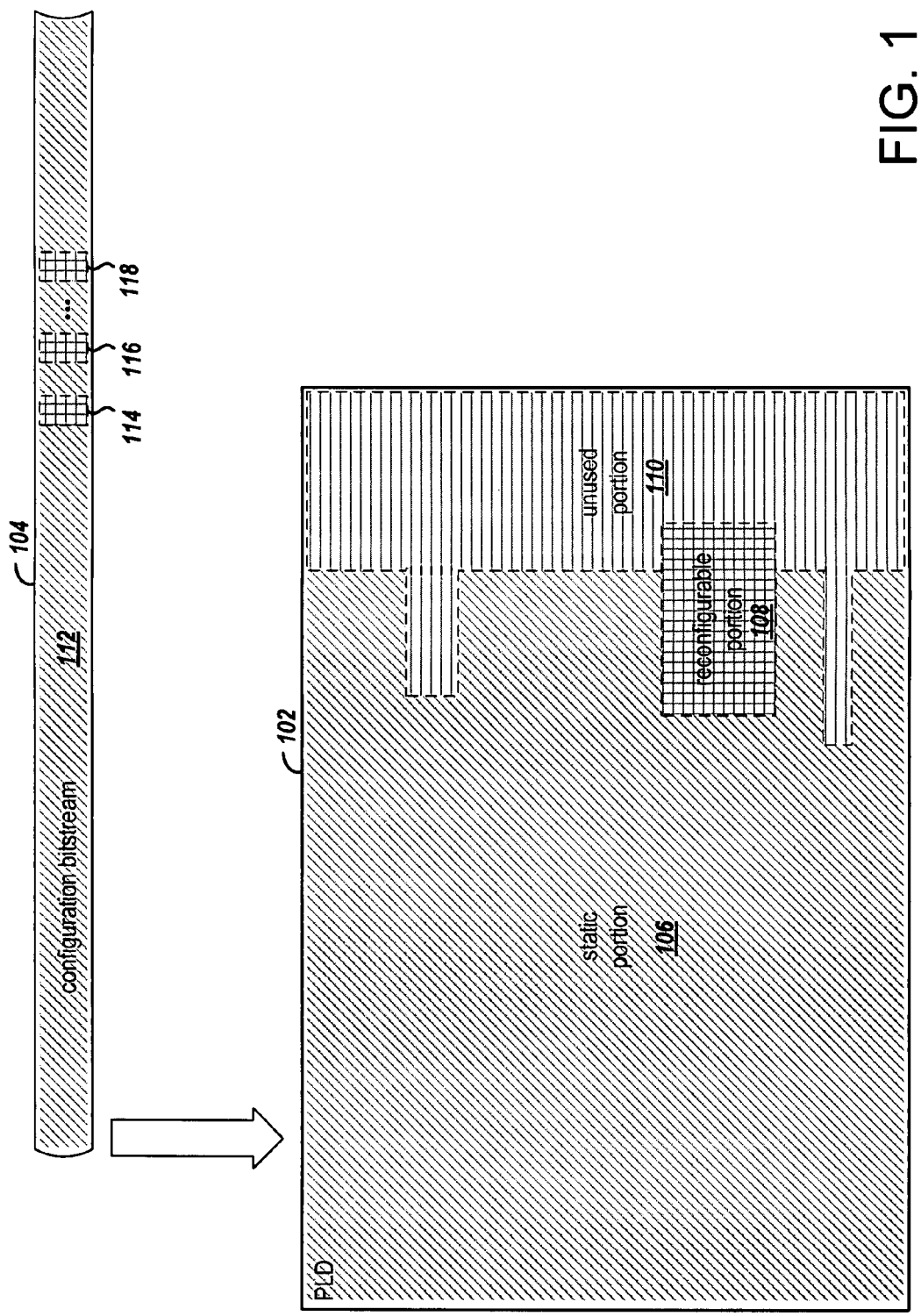
FIG. 1 illustrates a design implemented on a PLD in which part of the design is static and another part is reconfigurable. The configuration bitstream shows that an initial configuration may include both the static and reconfigurable portions of the design.

FIG. 1 illustrates a design implemented on a PLD 102 (e.g., an FPGA) in which part of the design is static and another part is reconfigurable. The configuration bitstream 104 shows that an initial configuration may include both the static and reconfigurable portions of the design. In the PLD, the area 106 filled with diagonal hatch lines represents resources of the PLD on which the static part of the design is implemented. The area 108 filled with cross-hatch lines represents resources of the PLD on which the reconfigurable part of the design is implemented. The area 110 filled with horizontal hatch lines represents resources of the PLD that are unused by the design.

The hatch line patterns in the configuration bitstream 104 correspond to the patterns described above for the PLD 102. The portion 112 of the bitstream filled with diagonal hatch lines corresponds to the static part of the design in area 106 of the PLD, and the portions 114, 116, and 118 with cross-hatch lines correspond to the reconfigurable part of the design in area 108 of the PLD.

It will be appreciated that the bits in the configuration bitstream for configuring the reconfigurable portion of the design in area 108 of the PLD need not occupy contiguous positions in the bitstream. For example, the bits in the bitstream may configure the PLD configuration memory cells column-by-column, and each column of configuration memory cells may contain bits for both the static portion and the reconfigurable portion of the design, as well as bits that are unused.

Figure 2:
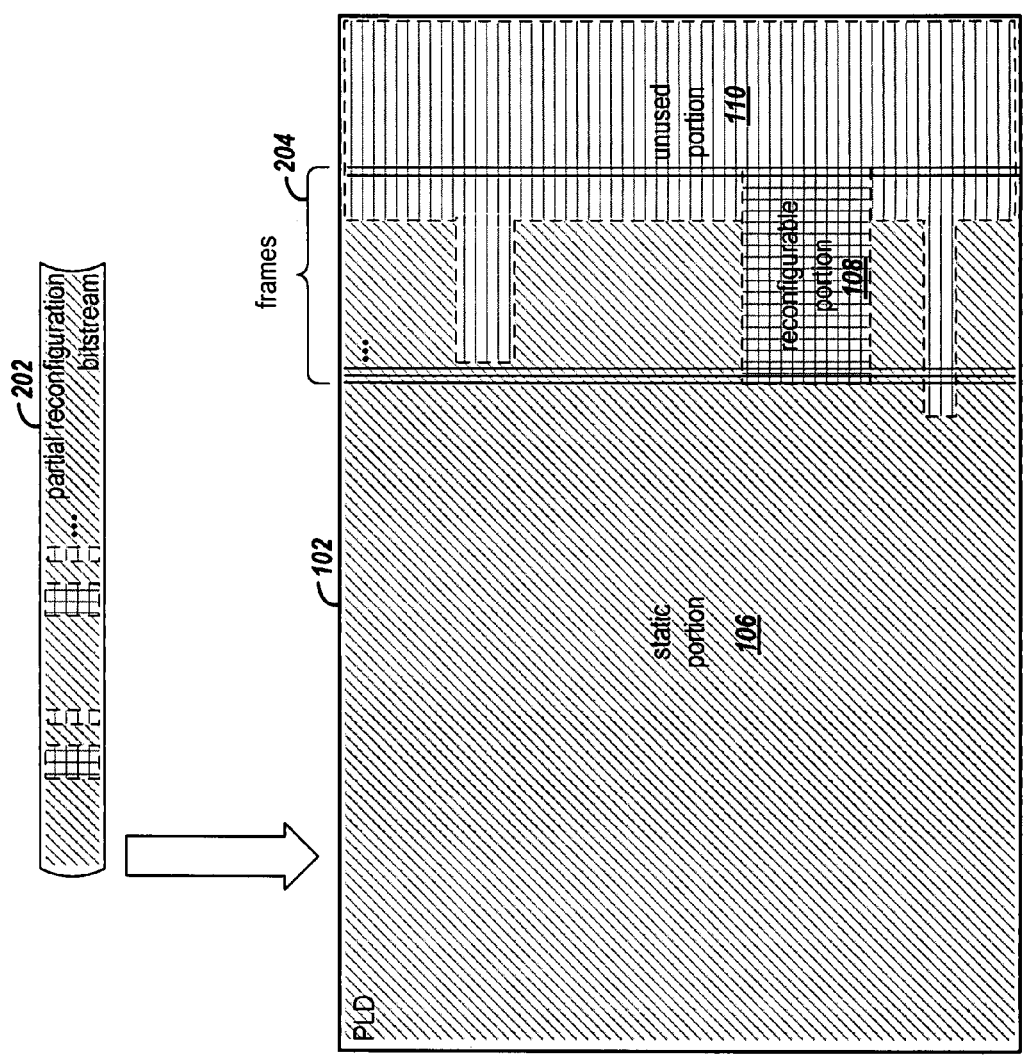
FIG. 2 illustrates input of a partial reconfiguration bitstream, which updates the reconfigurable part of the design, to the PLD.

FIG. 2 illustrates input of a partial reconfiguration bitstream 202, which updates the reconfigurable part of the design, to the PLD 102. As in FIG. 1, the diagonal hatch lines in the partial reconfiguration bitstream and PLD are associated with the static portion of the design, and the cross-hatch lines are associated with the reconfigurable portion of the design. The horizontal hatch lines in bitstream 202 are associated with the unused portion of the programmable logic.

The example PLD uses frame-based configuration, wherein each frame of configuration bits is designated for a column of configuration memory cells in the PLD. Example frames 204 illustrate the columns of configuration memory cells in the PLD which implement the reconfigurable portion of the design. The configuration memory cells in frames 204 also implement a part of the static portion of the design and further include configuration memory cells in the unused portion 110 of the PLD.

The example partial reconfiguration bitstream 202 includes configuration data for only those frames 204 of the PLD in which the reconfigurable portion of the design is implemented. The configuration bitstream also includes configuration data for the parts of the static portion of the design that are implemented in the frames of the reconfigurable portion of the design, and configuration data or placeholders for those portions of the PLD that are unused. Frame address information in the bitstream indicates to the configuration logic (not shown) of the PLD those frames of the PLD that are to be reconfigured.

Inadvertent or malicious programming of the PLD may be avoided by checking the partial reconfiguration bitstream either prior to an attempt to reconfigure the PLD or during the process of reconfiguring the PLD. The checking or verification of the partial reconfiguration bitstream relies on having pre-identified the "essential bits" of the design. "Essential bits" refer to those bits that implement the static portion of the design. The values of the essential bits may be either logic level "1" or "0," and the value of each bit may not be changed by the partial reconfiguration bitstream 202 in order to maintain the integrity of the implemented design.

Those bits that are essential are not visible (i.e., not readily apparent to the user) from the content of the partial reconfiguration bitstream, since the values of essential bits may include both logic levels "0" and "1." In an example embodiment, a bitmask is used to specify the essential bits. For each frame of the partial reconfiguration bitstream, a corresponding bitmask is used to indicate which bits are essential. In the example embodiment, a bit in the bitmask frame having logic level "1" indicates that the corresponding bit in the frame of the partial reconfiguration bitstream is essential and a logic level "0" indicates that the bit is not essential. A partial reconfiguration bitstream that configures the portion of the PLD with the reconfigurable portion of the design must program every essential bit to the same value as required by the static part of the design. If any essential bit in the partial reconfiguration bitstream has a value that is different from that required by the static part of the design, the partial reconfiguration bitstream is faulty and reconfiguration of the PLD is denied.

In the example of FIG. 2, one or more of the frames 204 include configuration bits for the unused portion 110 of the PLD. In one embodiment, it may be assumed that these "unused bits" are not essential bits, and the validity of the partial reconfiguration bitstream does not depend on the values of bits in the partial reconfiguration bitstream corresponding to these unused bits. In an alternative embodiment, the unused bits may be designated as essential bits.

Figure 3:
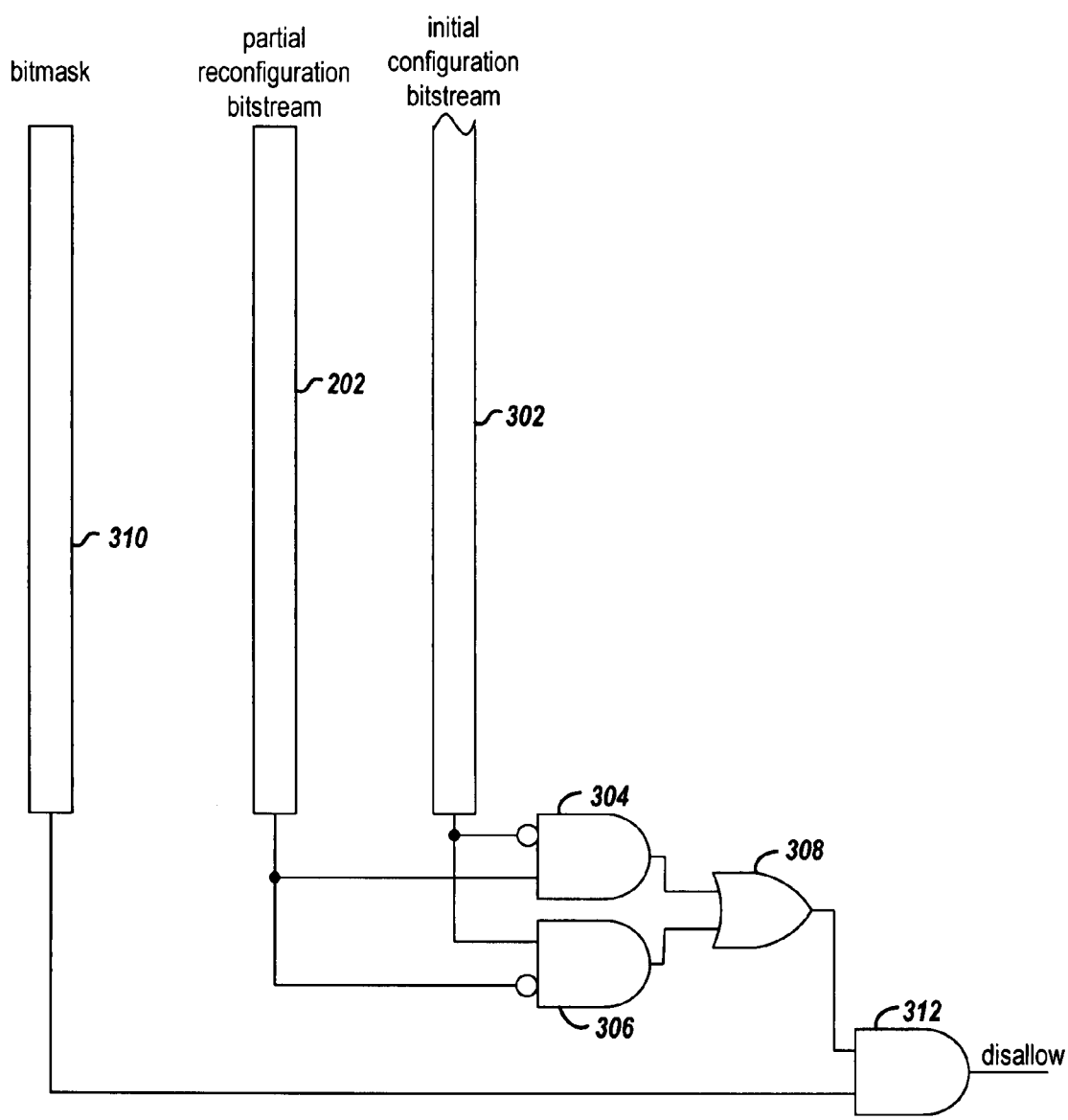
FIG. 3 shows example logic for determining whether a bit in the partial reconfiguration bitstream modifies a static part of the design and whether the partial reconfiguration should be disallowed.

FIG. 3 shows example logic for determining whether a bit in the partial reconfiguration bitstream modifies a static part of the design and whether the partial reconfiguration should be disallowed. If a value of a bit in the partial reconfiguration bitstream 202 is different from the corresponding bit in the initial configuration bitstream 302 (as determined by AND gates 304, 306 and OR gate 308) and the corresponding bit in the bitmask 310 indicates that the bit is essential (as determined by AND gate 312), then a "disallow" signal is asserted to disallow the partial reconfiguration with the partial reconfiguration bitstream 202.

Since the partial reconfiguration bitstream reconfigures only a subset of the PLD resources, which includes resources for implementing the reconfigurable portion of the design and may include additional resources used to implement the static part of the design, the illustrated initial configuration bitstream 302 includes only a portion of the full initial configuration bitstream. The illustrated portion contains those bits that correspond to the bits of the partial reconfiguration bitstream.

It will be appreciated that all essential bits in the partial reconfiguration bitstream 202 are verified for consistency with the initial configuration bitstream 302. If during the verification of the partial reconfiguration bitstream bits a single bit is found to be inconsistent, the verification may cease, since a change in only one bit may change the function of the static portion of the design. While not shown, it will be appreciated that various sequencing and control mechanisms may be implemented to address and read bits from the partial reconfiguration bitstream 202, initial configuration bitstream 302, and bitmask 310.

The illustrated verification logic may be implemented, for example, as a PLD-based circuit or as software executing on a processor. The processor may be either a soft processor implemented with PLD configurable logic resources or a hard processor disposed on the same die and connected to PLD resources. Depending on the implementation, the bitmask may be stored either internal or external to the PLD. The portion of the initial configuration bitstream used for verification may be obtained from the configured PLD using a configuration readback capability, or may be stored external to the PLD.

Figure 4:
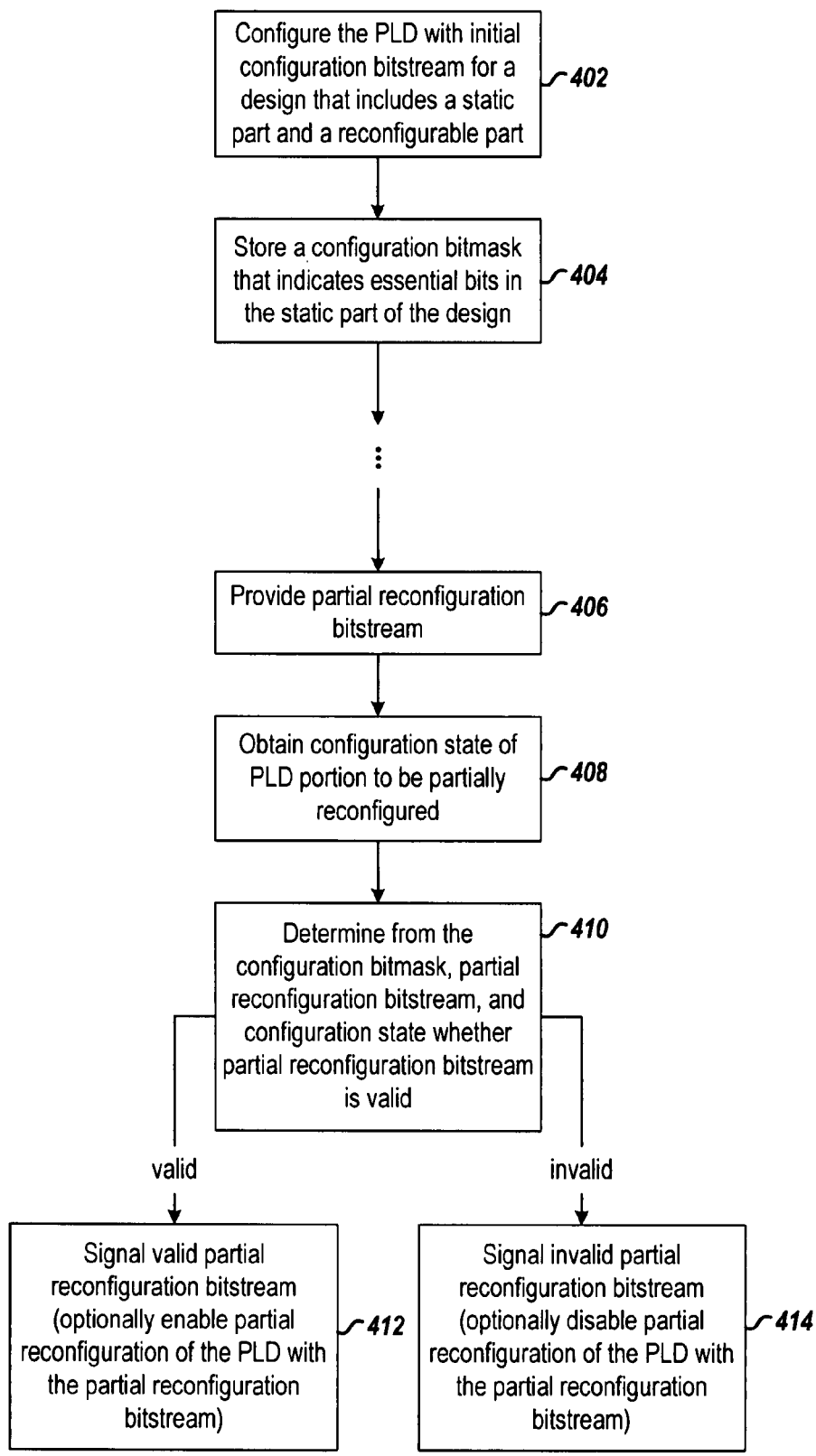
FIG. 4 is a flowchart of an example process for protecting against damaging the implementation of the static part of a design during partial reconfiguration of a PLD in accordance with an example embodiment of the invention.

FIG. 4 is a flowchart of an example process for protecting against corrupting the implementation of the static part of a design during partial reconfiguration of a PLD in accordance with an example embodiment of the invention. At step 402, the PLD is configured with an initial configuration bitstream for a design that includes a static part and a reconfigurable part. Various programmers are available for programming PLDs, with the particular programmer used depending on the type of the target PLD.

A configuration bitmask is stored at step 404 to indicate essential bits in the static part of the design. The bitmask indicating essential bits may be generated by hand based on analysis of the design, or with the support of a computer-based tool that is adapted for processing the configuration bitstream such as is used for detecting single event upsets in the configuration memory of a PLD.

At some time after the initial configuration of the PLD, partial reconfiguration of the PLD may be required, depending on application requirements. Prior to partially reconfiguring the PLD, at step 406 the partial reconfiguration bitstream is provided for verification. The partial reconfiguration bitstream may be verified external and prior to input to the PLD. Alternatively, the partial reconfiguration bitstream may be verified by logic implemented within the PLD. The partial reconfiguration bitstream may be read from an external data storage device, or may be generated and stored within addressable memory configured in the PLD.

At step 408, the configuration state is obtained for the PLD portion to be partially reconfigured. In one embodiment, the state may be obtained using the readback capability of the target PLD. In another embodiment, the state may be stored separately from the PLD configuration memory and read from external storage when verification is required.

The process determines at step 410 whether the partial reconfiguration bitstream is valid from the configuration bitmask, partial reconfiguration bitstream, and configuration state. This determination may be performed during development of the partial reconfiguration bitstream and just after the bitstream has been generated using design tools operating external to the PLD. Alternatively, the determination may be performed within the PLD after the bitstream has been loaded. Within the PLD, a soft processor, hard processor, configurable logic resources, and/or hardwired verification logic may be used to determine whether the partial reconfiguration bitstream is valid.

At step 412, a valid signal is output in response to all the essential bits in the partial reconfiguration bitstream matching the configuration state of the portion of the PLD targeted by the partial reconfiguration bitstream. In an example embodiment, partial reconfiguration of the PLD with the partial reconfiguration bitstream may be enabled in response to the partial reconfiguration bitstream being valid. Alternatively or in combination, a message may be output to the user indicating that the partial reconfiguration bitstream is valid. In response to a mismatch between the essential bits and the configuration state, at step 414 an error code may be output. In one embodiment, the partial reconfiguration of the PLD with the partial reconfiguration bitstream may disabled in response to the error code.

Figure 5:
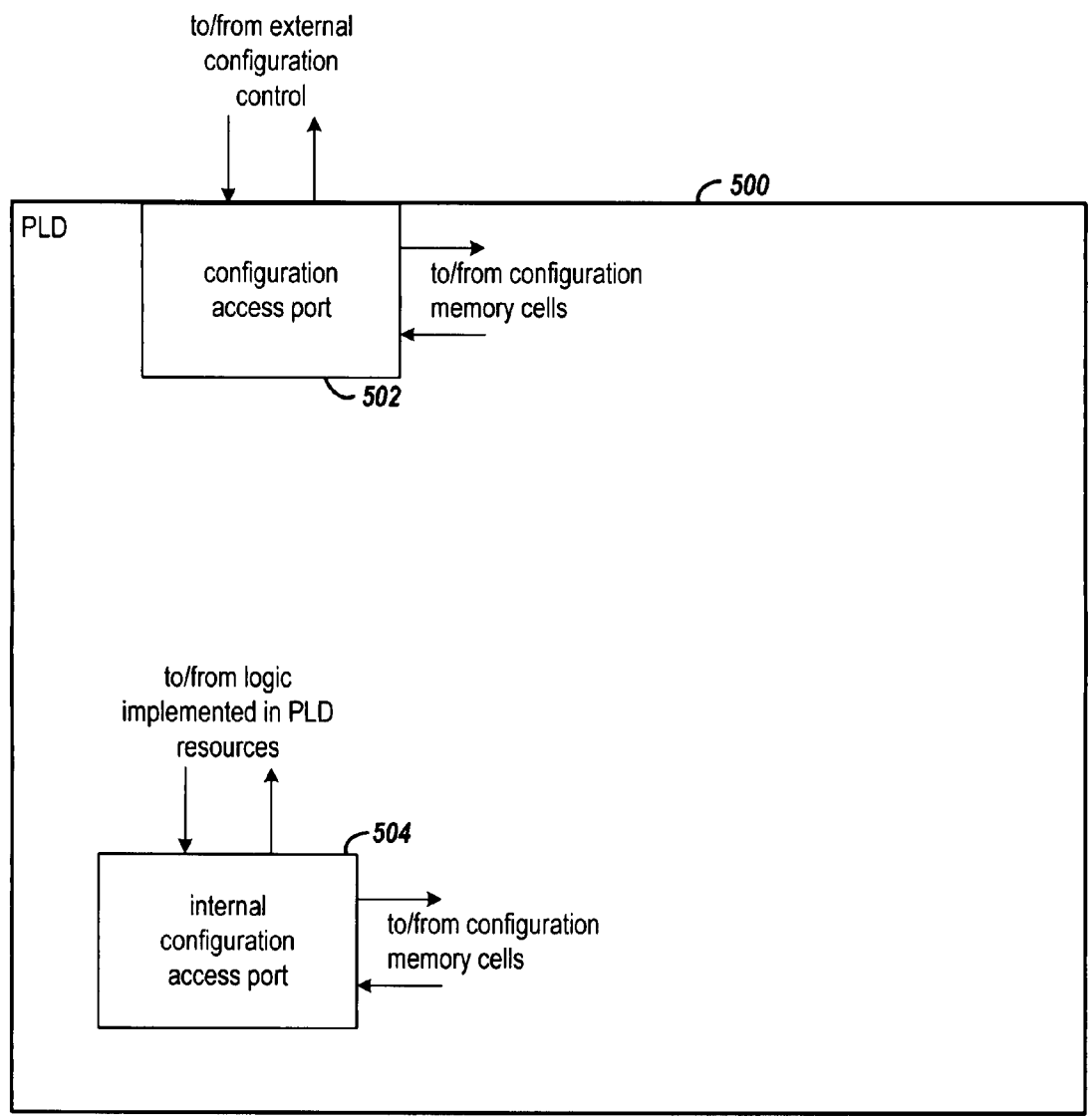
FIG. 5 is an example PLD in which one configuration access port provides external control over configuration, reconfiguration and readback of the PLD, and an internal configuration access port provides internal control over configuration, reconfiguration and readback of the PLD.

FIG. 5 is an example PLD 500 in which one configuration access port 502 provides external control over configuration, reconfiguration and readback of the PLD, and an internal configuration access port 504 provides internal control over configuration, reconfiguration and readback of the PLD. The configuration access port 502 is accessible to device programmers that are external to the PLD. The internal configuration access port 504 is accessible to logic implemented in resources of the PLD, as well as to a hard processor disposed on the same die as the configurable logic resources. Both the configuration access port 502 and internal configuration access port 504 address and write to the configuration memory cells of the PLD in response to an input configuration bitstream (or partial reconfiguration bitstream). In addition, both configuration access ports provide a readback capability to read the state from the configuration memory cells and output the state to the requesting logic. Various families of PLDs from XILINX have both types of configuration access ports.

Depending on implementation requirements, either configuration access port may be used to verify a partial reconfiguration bitstream. For example, if the partial reconfiguration bitstream is to be verified external to the PLD, then the configuration access port 502 may be used to read back the configuration state, if needed, and input the partial reconfiguration bitstream to the PLD once it has been verified. For internal verification, the internal configuration access port 504 may be used to read back the configuration state and to input a verified partial reconfiguration bitstream.

FIG. 6 illustrates an example FPGA architecture 600 on which a system may be implemented using the various approaches described herein. FPGA 600 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include a hardwired processor 610 disposed on the same integrated circuit die as the programmable logic resources of the FPGA.

In some FPGAs, each programmable tile includes a programmable interconnect element (INT 611) having standardized connections to and from a corresponding interconnect element in each adjacent tile. Therefore, the programmable interconnect elements taken together implement the programmable interconnect resources for the illustrated FPGA. The programmable interconnect element (INT 611) also includes the connections to and from the programmable logic primitive within the same tile, as shown by the examples included at the top of FIG. 6.

For example, a CLB 602 can include a configurable logic primitive (CLE 612) that can be programmed to implement user logic plus a single programmable interconnect element (INT 611). A BRAM 603 can include a BRAM logic primitive (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic primitive (DSPL 614) in addition to an appropriate number of programmable interconnect elements. An IOB 604 can include, for example, two instances of an input/output logic primitive (IOL 615) in addition to one instance of the programmable interconnect element (INT 611). As will be clear to those of skill in the art, the actual I/O pads connected, for example, to the I/O logic primitive 615 are manufactured using metal layered above the various illustrated logic blocks, and typically are not confined to the area of the input/output logic primitive 615.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Configuration port 618 may be used to access configuration memory in the FPGA 616 to configure the programmable logic and interconnect resources. In one embodiment, an internal scrubber (not shown) may continuously read and correct configuration memory via an internal configuration access port. One or more soft processors may be implemented on the programmable logic resources of the FPGA, as illustrated by blocks 622. Example soft processors are MICROBLAZE™ processors that may be implemented on XILINX FPGAs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

In an example scenario in which one or more embodiments of the invention may be used, the static part of the design includes a soft processor that executes an operating system (OS) along with selected application software. A portion of the PLD is designated as a socket that is reconfigurable to implement a computational resource accessible to either the OS or application software executing on the processor. A user may log in to the OS and direct the loading of a partial reconfiguration bitstream for reconfiguring the socket. With this access, the user may intentionally or unintentionally load a partial reconfiguration bitstream that corrupts the static part of the design and potentially causes the processor to undesirably cease operations. This situation may be avoided by configuring the OS kernel to verify the partial reconfiguration bitstream prior to allowing the partial reconfiguration. If the input partial reconfiguration bitstream fails the verification process, partial reconfiguration is denied.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for configuring PLDs. Further, while FPGAs are used as exemplary PLDs herein, the present invention may also be applied to other types of PLDs that may be partially reconfigured using configuration bitstreams. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for validating a configuration bitstream used for partially reconfiguring an integrated circuit, the method comprising:

configuring the integrated circuit with a first configuration bitstream, wherein the first configuration bitstream includes first bit values that produce an implementation of a static part of a design on the integrated circuit;

determining whether any bit value in a second configuration bitstream is different from a corresponding bit value of the implementation of the static part of the design, wherein the second configuration bitstream includes second bit values that produce an implementation of a reconfigurable part of the design on the integrated circuit;

outputting a first signal state in response to determining that no bit values in the second configuration bitstream are different from corresponding bit values of the implementation of the static part of the design; and outputting a second signal state in response to determining that one or more bit values in the second configuration bitstream are different from corresponding bit values of the implementation of the static part of the design.

2. The method of claim 1, wherein the determining comprises:

comparing bit values in the second configuration bitstream to corresponding bit values of configuration memory cells on the integrated circuit;

for each bit value in the second configuration bitstream that is not equal to the corresponding bit value of the configuration memory cell, determining from a corresponding bit value in a bitmask whether the corresponding bit value in the second configuration bitstream is essential to the implementation of the static part of the design; and for a bit value in the second configuration bitstream determined to be essential and that is not equal to the corresponding bit value of the configuration memory cell, signaling that the bit value in the second configuration bitstream is different from the corresponding bit value of the implementation of the static part of the design.

3. The method of claim 2, wherein the steps of configuring, determining, outputting the first signal state, and outputting the second signal state are performed by a processor disposed on a die with configurable logic resources of the integrated circuit.

4. The method of claim 3, wherein the processor is a hard-wired processor.

5. The method of claim 3, wherein the processor is implemented on configurable logic resources of the integrated circuit.

6. The method of claim 1, wherein the steps of configuring, determining, outputting the first signal state, and outputting the second signal state are performed by a processor disposed on a die with configurable logic resources of the integrated circuit.

7. The method of claim 6, wherein the processor is a hard-wired processor.

8. The method of claim 6, wherein the processor is implemented on configurable logic resources of the integrated circuit, wherein the integrated circuit is a programmable logic device.

9. The method of claim 1, further comprising:

reading from the integrated circuit, bit values of configuration memory cells that correspond to configuration memory cells to be programmed by the second configuration bitstream; and using the bit values read from the integrated circuit in the determining whether any bit value in the second configuration bitstream is different from the corresponding bit value of the implementation of the static part of the design.

10. The method of claim 9, wherein the steps of configuring, determining, outputting the first signal state, and outputting the second signal state, reading, and using the bit values are performed by a processor disposed on a die with configurable logic resources of the integrated circuit.

11. The method of claim 10, wherein the processor is a hard-wired processor.

12. The method of claim 10, wherein the processor is implemented on configurable logic resources of the integrated circuit, wherein the integrated circuit is a programmable logic device.

13. The method of claim 1, further comprising:

partially re-configuring the integrated circuit with the second configuration bitstream in response to the first signal state; and disabling partial re-configuration of the integrated circuit with the second configuration bitstream in response to the second signal state.

14. The method of claim 1, wherein the steps of configuring, determining, outputting the first signal state, and outputting the second signal state are performed by a processor external to a die with configurable logic resources of the integrated circuit.

15. The method of claim 14, wherein the determining comprises:

comparing bit values in the second configuration bitstream to corresponding bit values of configuration memory cells on the integrated circuit;

for each bit value in the second configuration bitstream that is not equal to the corresponding bit value of the configuration memory cell, determining from a corresponding bit value in a bitmask whether the corresponding bit value in the second configuration bitstream is essential to the implementation of the static part of the design; and for a bit value in the second configuration bitstream determined to be essential and that is not equal to the corresponding bit value of the configuration memory cell, signaling that the bit value in the second configuration bitstream is different from the corresponding bit value of the implementation of the static part of the design.

16. The method of claim 15, further comprising:

reading from the integrated circuit bit values of configuration memory cells that correspond to configuration memory cells to be programmed by the second configuration bitstream; and using the bit values read from the integrated circuit in the comparing of the bit values in the second configuration bitstream to the corresponding bit values of the configuration memory cells.

17. The method of claim 15, further comprising:

reading from storage external to the integrated circuit, bit values of configuration memory cells that correspond to configuration memory cells to be programmed by the second configuration bitstream; and using the bit values read from the storage in the comparing of the bit values in the second configuration bitstream to the corresponding bit values of the configuration memory cells.

18. The method of claim 15, further comprising:

wherein outputting the first signal state includes outputting a user-visible code indicative of the second configuration bitstream being valid; and wherein outputting the second signal state includes outputting a user-visible error code.

19. An apparatus for validating a configuration bitstream used for partially reconfiguring an integrated circuit, the apparatus comprising:

means for configuring the integrated circuit with a first configuration bitstream, wherein the first configuration bitstream includes first bit values that produce an implementation of a static part of a design on the integrated circuit;

means for determining whether any bit value in a second configuration bitstream is different from a corresponding bit value of the implementation of the static part of the design, wherein the second configuration bitstream includes second bit values that produce an implementation of a reconfigurable part of the design on the integrated circuit;

means for outputting a first signal state in response to determining that no bit values in the second configuration bitstream are different from corresponding bit values of the implementation of the static part of the design; and means for outputting a second signal state in response to determining that one or more bit values in the second configuration bitstream are different from corresponding bit values of the implementation of the static part of the design.

20. An article of manufacture, comprising:

a processor-readable storage medium configured with processor-executable instructions for validating a configuration bitstream used for partially reconfiguring an integrated circuit, wherein execution of the instructions cause one or more processors to perform the steps including, configuring the integrated circuit with a first configuration bitstream, wherein the first configuration bitstream includes first bit values that produce an implementation of a static part of a design on the integrated circuit;

determining whether any bit value in a second configuration bitstream is different from a corresponding bit value of the implementation of the static part of the design, wherein the second configuration bitstream includes second bit values that produce an implementation of a reconfigurable part of the design on the integrated circuit;

outputting a first signal state in response to determining that no bit values in the second configuration bitstream are different from corresponding bit values of the implementation of the static part of the design; and outputting a second signal state in response to determining that one or more bit values in the second configuration bitstream are different from corresponding bit values of the implementation of the static part of the design.

* * * * *